(12) United States Patent
Lee et al.

(10) Patent No.: US 8,916,847 B2
(45) Date of Patent: Dec. 23, 2014

(54) VARIABLE RESISTANCE MEMORY DEVICE AND METHOD FOR FABRICATING THE SAME

(71) Applicant: SK Hynix Inc., Gyeonggi-do (KR)

(72) Inventors: Hyun-Min Lee, Gyeonggi-do (KR); Jung-Taik Cheong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/720,233

(22) Filed: Dec. 19, 2012

(65) Prior Publication Data

US 2014/0027701 A1    Jan. 30, 2014

(30) Foreign Application Priority Data

Jul. 26, 2012    (KR) .......................... 10-2012-0081805

(51) Int. Cl.
*H01L 45/00* (2006.01)
*H01L 27/24* (2006.01)

(52) U.S. Cl.
CPC ............... *H01L 45/04* (2013.01); *H01L 45/16* (2013.01); *H01L 45/141* (2013.01); *H01L 27/2463* (2013.01); *H01L 45/00* (2013.01)
USPC .............. 257/3; 257/4; 257/42; 257/E45.002; 257/E21.002; 438/478; 438/382; 438/102

(58) Field of Classification Search
CPC ......... H01L 45/06; H01L 45/04; H01L 45/16; H01L 45/00; H01L 27/2463; H01L 45/141
USPC .................... 257/3, 4, 42, E45.002, E29.087, 257/E21.002; 438/478, 382, 102
See application file for complete search history.

(56) References Cited

U.S. PATENT DOCUMENTS

2010/0176365 A1 *    7/2010    Park et al. ...................... 257/3

FOREIGN PATENT DOCUMENTS

| KR | 1020110071506 | 6/2011 |
| KR | 1020110113054 | 10/2011 |

* cited by examiner

*Primary Examiner* — Thinh T Nguyen
(74) *Attorney, Agent, or Firm* — IP & T Group LLP (57) ABSTRACT

A variable resistance memory device includes a plurality of first conductive lines extended in a first direction, a plurality of second conductive lines arranged over or under the first conductive lines and extended in a second direction crossing the first direction, an insulating layer disposed between the first conductive lines and the second conductive lines and having a trench extended in the second direction and defined by a first sidewall and a second sidewall facing each other and a bottom surface connecting the first sidewall and the second sidewall, and a variable resistance material layer formed on the first and second sidewalls and the bottom surface of the trench, wherein the first and second sidewalls of the trench overlap two adjacent second conductive lines, respectively.

12 Claims, 9 Drawing Sheets

VARIABLE RESISTANCE MEMORY DEVICE AND METHOD FOR FABRICATING THE SAME

CROSS-REFERENCE TO RELATED APPLICATIONS

The present application claims priority of Korean Patent Application No. 10-2012-0081805, filed on Jul. 26, 2012, which is incorporated herein by reference in its entirety.

BACKGROUND

1. Field

Exemplary embodiments of the present invention relate to a semiconductor memory technology, and more particularly, to a variable resistance memory device and a method for fabricating the same.

2. Description of the Related Art

A variable resistance memory device stores data using a variable resistance material that switches between different resistance states depending on a supplied voltage or current. Currently, various variable resistance memory devices such as ReRAM (Resistive Random Access Memory), PCRAM (Phase-change Random Access Memory), FRAM (Ferro-electric Random Access Memory), and MRAM (Magnetic Random Access Memory) have been developed.

Figure 1:
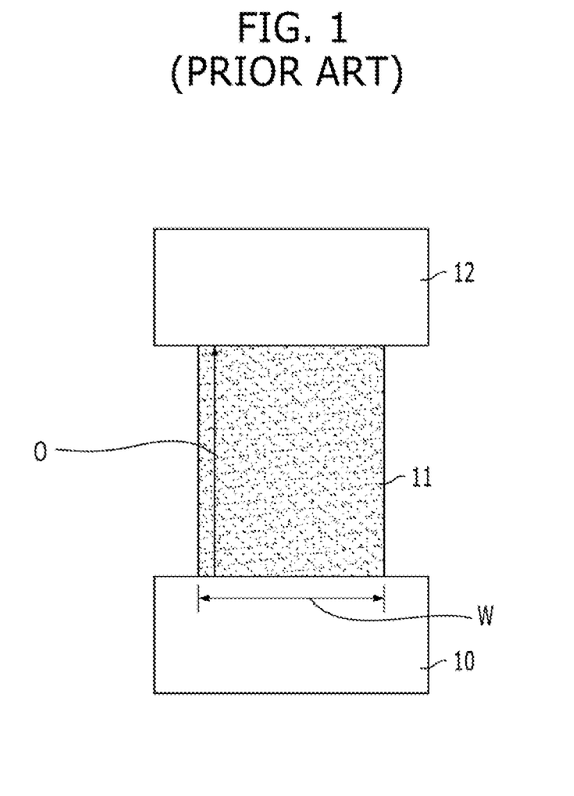
FIG. 1 is a cross-sectional view illustrating a conventional variable resistance memory device.

FIG. 1 is a cross-sectional view illustrating a conventional variable resistance memory device.

Referring to FIG. 1, the variable resistance memory device includes a bottom electrode 10, a top electrode 12 and a variable resistance material layer 11 interposed therebetween. The variable resistance memory device may be fabricated by a series of processes of forming a bottom electrode 10 over a substrate (not illustrated) having a predetermined lower structure formed therein, depositing a variable resistance material on the resulting structure having the bottom electrode 10 formed thereon, forming a variable resistance material layer 11 by selectively etching the deposited variable resistance material, and forming a top electrode 12 over the variable resistance layer 11.

However, during the etch process for forming the variable resistance material layer 11, the sidewalls of the variable resistance material layer 11 may be deformed by an impact. In this case, since a leakage current (refer to symbol O) occurs through the sidewalls of the variable resistance material layer 11, there are difficulties in implementing a variable resistance memory device having a desired characteristic.

Furthermore, as the width W of the variable resistance material layer 11 decreases, it is advantageous in increasing an integration degree and securing a switching characteristic. In the case of ReRAM of which the resistance is changed by creation and destruction of a conductive filament, when the width W of the variable resistance material layer 11 is small, the creation and destruction of the conductive filament is controlled at a regular position. Therefore, a uniform switching characteristic may be secured. As described above, however, the variable resistance material layer 11 is patterned through an etch process. Therefore, there is a limitation in reducing the width W.

SUMMARY

Exemplary embodiments of the present invention are directed to a variable resistance memory device and a method for fabricating the same, which is capable of securing a uniform switching characteristic, increasing an integration degree, and simplifying the process.

In accordance with an embodiment of the present invention, a variable resistance memory device includes a plurality of first conductive lines extended in a first direction, a plurality of second conductive lines arranged over or under the first conductive lines and extended in a second direction crossing the first direction, an insulating layer disposed between the first conductive lines and the second conductive lines and having a trench extended in the second direction and defined by a first sidewall and a second sidewall facing each other and a bottom surface connecting the first sidewall and the second sidewall, and a variable resistance material layer formed on the first and second sidewalls and the bottom surface of the trench, wherein the first and second sidewalls of the trench overlap two adjacent second conductive lines, respectively.

In accordance with another embodiment of the present invention, a method for fabricating a variable resistance memory device includes forming first conductive lines over a substrate, the first conductive lines extending in a first direction, forming an insulating layer over the first conductive lines, selectively etching the insulating layer to form a trench defined by a first sidewall and a second sidewall and a bottom surface connecting the first sidewall and the second sidewall, forming a variable resistance material layer on the first and second sidewalls and bottom surface of the trench, and forming a plurality of second conductive lines over the variable resistance material layer, the second conductive lines extending in a second direction crossing the first direction, wherein the first and second sidewalls of the trench are extended in the first direction and overlap two adjacent first conductive lines, respectively, or are extended in the second direction and overlap two adjacent second conductive lines, respectively.

In accordance with another embodiment of the present invention, a variable resistance memory device includes an insulating layer formed over a substrate and having a trench extended in a second direction, that is defined by a first sidewall and a second sidewall facing each other and a bottom surface connecting the first sidewall and the second sidewall, a variable resistance material layer formed on the first and second sidewalls and the bottom surface of the trench, and an insulating pattern formed over the variable resistance material layer and filling the trench.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, 'connected/coupled' represents that one component is directly coupled to another component or indirectly coupled through another component. In addition, a singular form may include a plural form as long as it is not specifically mentioned in a sentence.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Referring to FIGS. 2A to 3D, a variable resistance memory device and a method for fabricating the same in accordance with a first embodiment of the present invention will be described.

Figure 2A:
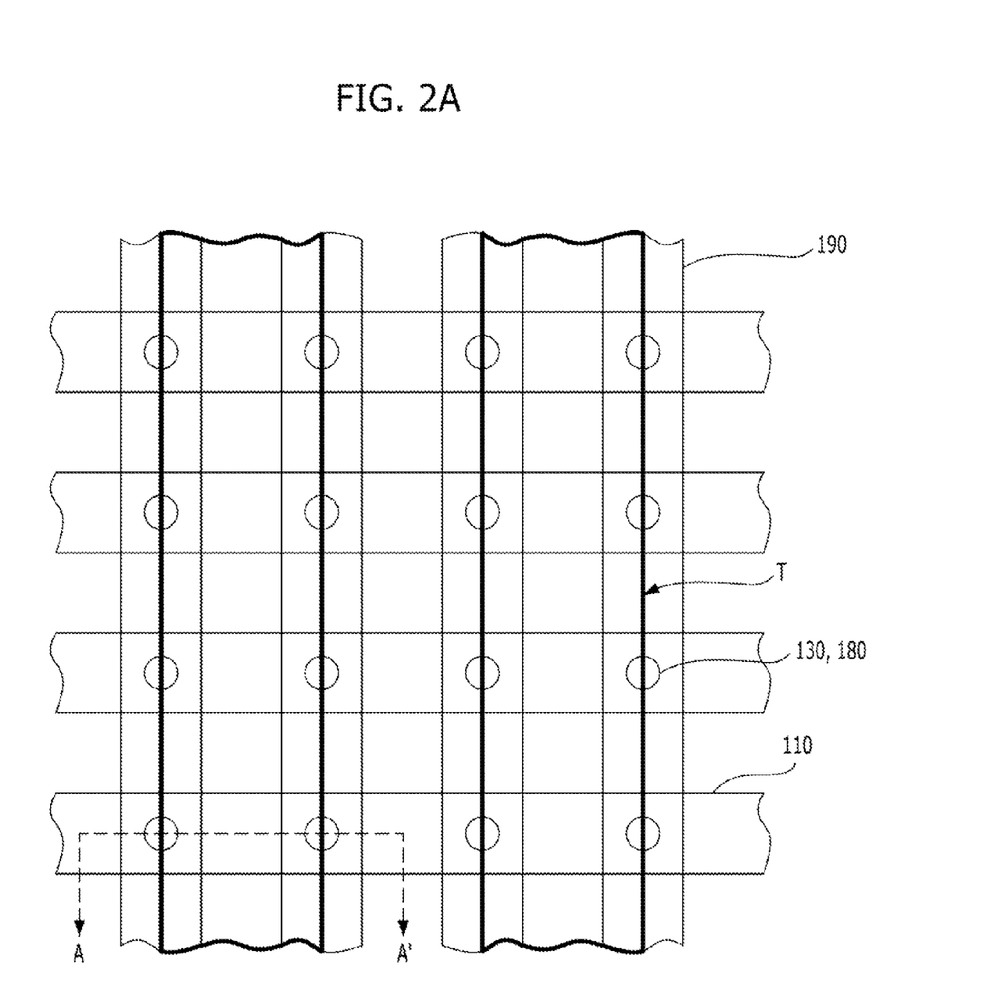
FIGS. 2A to 2C are diagrams illustrating a variable resistance memory device in accordance with a first embodiment of the present invention.
Figure 2B:
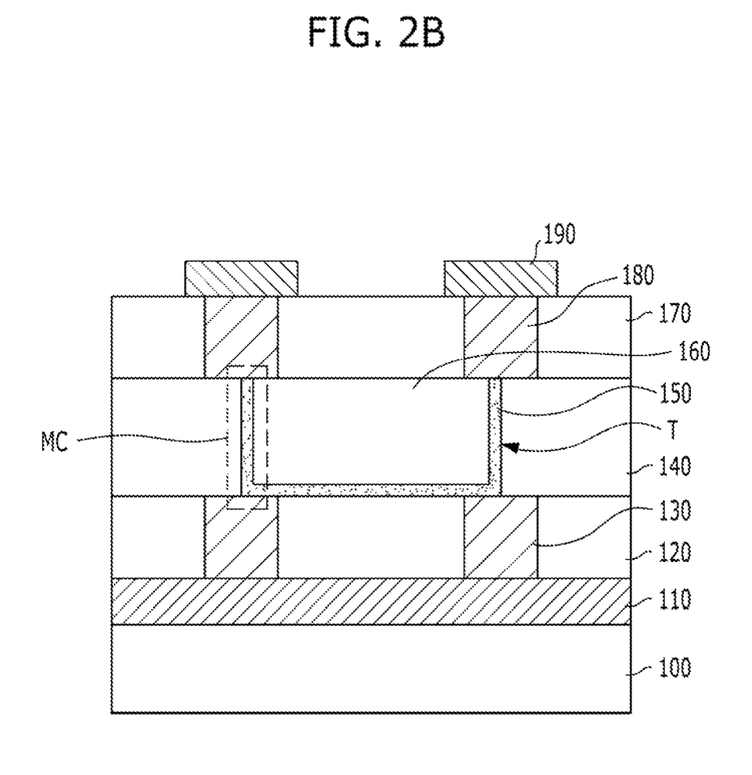
Figure 2C:
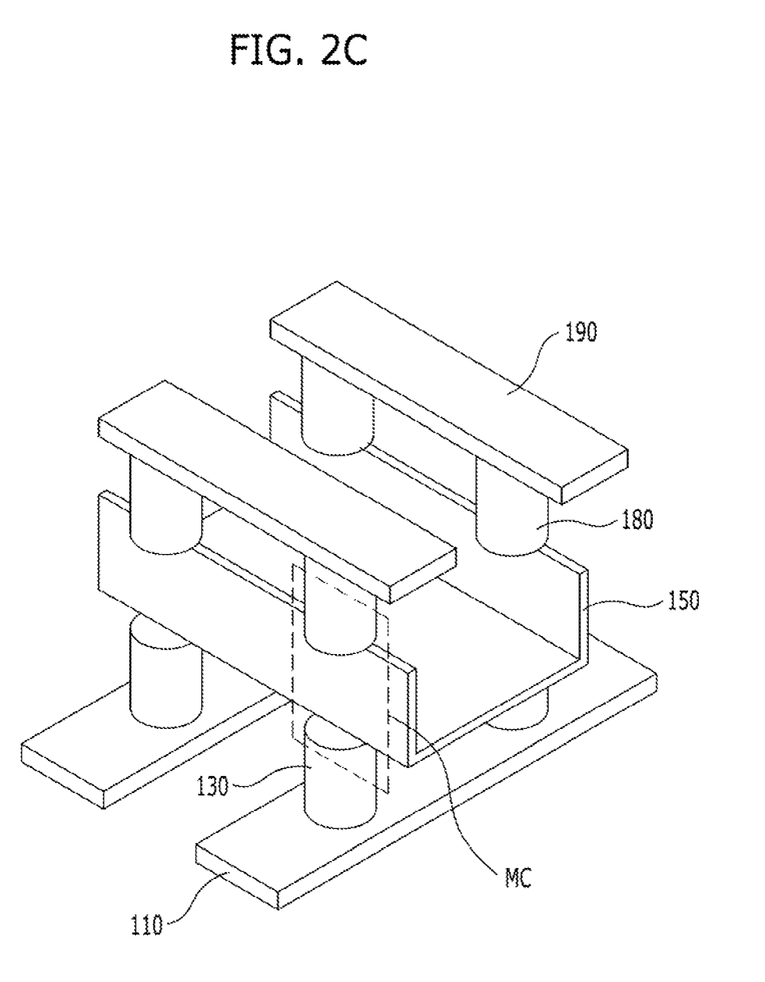

FIGS. 2A to 2C are diagrams illustrating the variable resistance memory device in accordance with the first embodiment of the present invention. FIG. 2A is a plan view, FIG. 2B is a cross-sectional view taken along line A-A' of FIG. 2A, and FIG. 2C is a perspective view.

Referring to FIGS. 2A to 2C, the variable resistance memory device in accordance with the first embodiment of the present invention includes a substrate 100, a plurality of lower conductive lines 110, a plurality of upper conductive lines 190, a lower conductive contact 130, an upper conductive contact 180, a second insulating layer 140, and a variable resistance material layer 150. The substrate 100 includes a predetermined lower structure (not illustrated) formed therein. The plurality of lower conductive lines 110 are arranged over the substrate 100 and extended in a direction parallel to line A-A' as shown in FIG. 2C (hereafter, referred to as a first direction). The plurality of upper conductive lines 190 are arranged over the lower conductive lines 110 and extended in a second direction crossing the first direction as shown in FIG. 2C. The lower conductive contact 130 is disposed at each of the intersections between the lower conductive lines 110 and the upper conductive lines 190, and contacted with the lower conductive line 110. The upper conductive contact 180 is disposed at each of the intersections between the lower conductive lines 110 and the upper conductive lines 190, and contacted with the upper conductive line 190. The second insulating layer 140 is interposed between the lower conductive contacts 130 and the upper conductive contacts 180, and includes a trench T. The variable resistance material layer 150 is formed along the sidewalls and bottom surface of the trench T.

The trench T may have a shape extending in the second direction in parallel to the upper conductive line 190. When both sidewalls of the trench T extending in the second direction are referred to as first and second sidewalls, the first sidewall may overlap any one of two adjacent upper conductive lines 190, and the second sidewall may overlap the other of the two adjacent upper conductive lines 190. Accordingly, the bottom surface of the trench T connecting the first and second sidewalls overlaps parts of the two adjacent upper conductive lines 190 and a space therebetween. The variable resistance material layer 150 formed along the sidewalls and bottom surface of the trench T may have a line shape extending in the second direction, when viewed from the top.

In this embodiment of the present invention, the trench T is formed between the lower conductive contact 130 and the upper conductive contact 180. Therefore, parts of the lower conductive contacts 130, which are arranged in the second direction while overlapping the two adjacent upper conductive lines 190, overlap the trench T. Furthermore parts of the upper conductive contacts 180, which are arranged in the second direction while overlapping the two adjacent upper conductive lines 190, overlap the trench T. Since the variable resistance material layer 150 is formed along the first and second sidewalls and bottom surface of the trench T, the variable resistance material layer 150 are contacted with the upper conductive contact 180 by the thickness of the variable resistance material layer 150, while contacted with the part of the lower conductive contact 130. Accordingly, the contact area between the variable resistance material layer 150 and the upper conductive contact 180 is larger than the contact area between the variable resistance material layer 150 and the lower conductive contact 130.

The lower conductive line 110, the upper conductive line 190, the lower conductive contact 130, and the upper conductive contact 180 may include metals such as platinum (Pt), tungsten (W), aluminum (Al) copper (Cu), and tantalum (Ta) or metal nitrides such as titanium nitride (TiN) and tantalum nitride (TaN). The variable resistance material layer 150 may include a single layer or multilayer including an oxide of transition metal such as Ta, Ni, Ti, Fe, Co, Mn or W, a perovskite-based material, and a solid electrolyte such as GeSe, but the present invention is not limited thereto. The variable resistance material layer 150 may include any materials capable of switching between different resistance states depending on a supplied voltage or current. For example, the materials may include any one of materials used for ReRAM (Resistive Random Access Memory), PCRAM (Phase-change Random Access Memory), FRAM (Ferroelectric Random Access Memory), MRAM (Magnetic Random Access Memory) and the like.

The second insulating layer 140 may include oxide or nitride. Reference numerals 120, 160, and 170 represent a first insulating layer, an insulating pattern, and a third insulating layer, respectively, which may include oxide or nitride.

In the variable resistance memory device in accordance with the embodiment of the present invention, unit memory cells (refer to symbol MC) are formed at the respective intersections between the lower conductive lines 110 and the upper conductive lines 190. That is, the variable resistance material layer 150 on the first sidewall of one trench T overlapping the lower conductive line 110 forms one memory cell, and the variable resistance material layer 150 on the second sidewall of the trench T forms another memory cell. The variable resistance material layers 150 of the memory cells arranged in the second direction are connected to each other. On the other hand, the variable resistance material layer of one memory cell in the first direction is connected to the variable resistance material layer 150 of another memory cell disposed at one side adjacent to the memory cell, but is not connected to the variable resistance material layer 150 of another memory cell disposed at the other side adjacent to the memory cell.

Hereafter, the method for fabricating the variable resistance memory device in accordance with the embodiment of the present invention will be described.

FIGS. 3A to 3D are diagrams illustrating the method for fabricating the variable resistance memory device of FIGS. 2A to 2C. In particular, FIGS. 3A to 3D are cross-sectional views taken along line A-A' of FIG. 2A, illustrating intermediate steps for fabricating the device of FIGS. 2A to 2C.

Figure 3A:
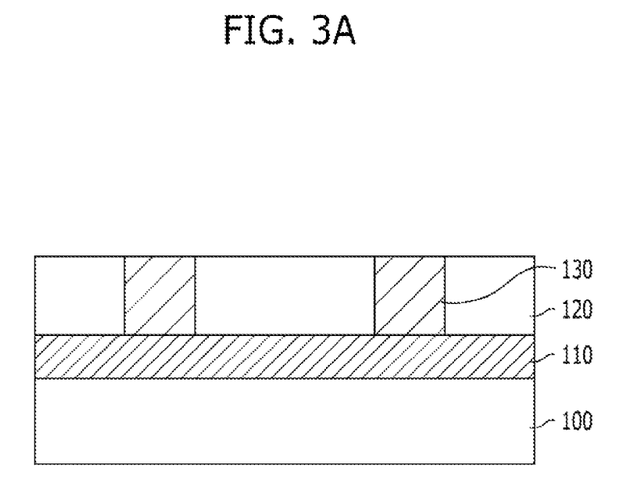
FIGS. 3A to 3D are diagrams illustrating a method for fabricating the variable resistance memory device of FIGS. 2A to 2C.

Referring to FIG. 3A, a conductive material is deposited on the substrate 100 and selectively etched to form a plurality of lower conductive lines 110 extending in the first direction.

Then, a first insulating layer 120 is formed to cover the substrate 100 having the lower conductive lines 110 formed thereon.

The first insulating layer 120 is selectively etched to form contact holes exposing the lower conductive lines 110, and the contact holes are filled with a conductive material to form a plurality of lower conductive contacts 130. As described above, the lower conductive contacts 130 are formed at the respective intersections between the lower conductive lines 110 and the upper conductive lines to be described below.

Figure 3B:
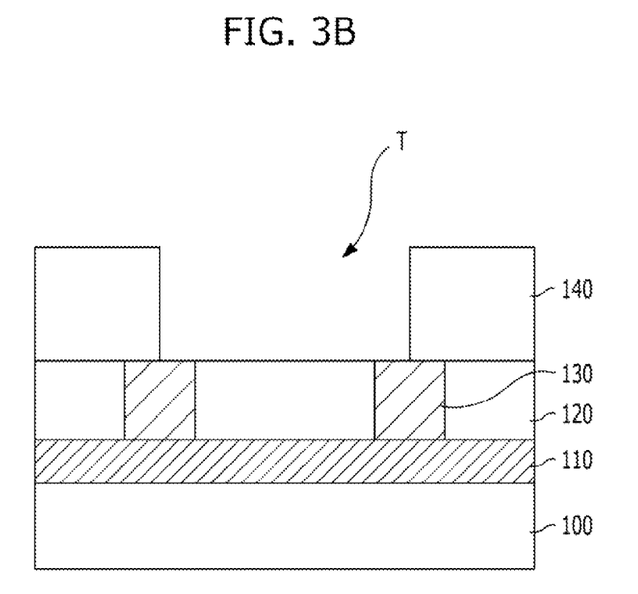

Referring to FIG. 3B, a second insulating layer 140 is formed over the structure shown in FIG. 3A, and selectively etched to form a trench T. When the lower conductive contacts 130 arranged in the second direction to overlap the upper conductive lines to be described below are set to columns of lower conductive contacts 130, the trench T is formed to expose a right part of a column of lower conductive contacts 130, a left part of another column of lower conductive contacts 130 adjacent to the column of lower conductive contacts 130, and a space therebetween.

During the etch process for forming the trench T, an etch recipe capable of preventing the damage to the lower conductive contacts 130 may be used. For example, when the second insulating layer 140 includes oxide, the etch process may be performed using a $CF_X$-based etching gas. Furthermore, although not illustrated, a thin oxide layer may be formed on the surface of the lower conductive contact 130 when a photoresist pattern used during the etch process for forming the trench T is removed. Therefore, after the trench T is formed, a cleaning process for removing the thin oxide layer may be additionally performed.

Figure 3C:
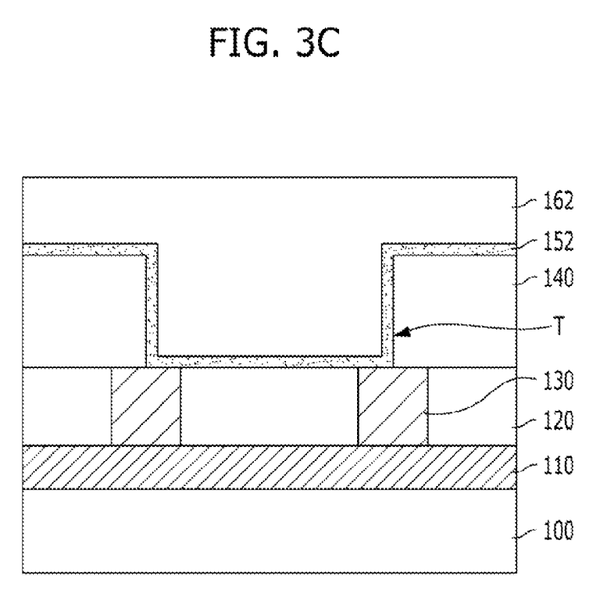

Referring to FIG. 3C, an initial variable resistance material layer 152 is formed over the structure shown in FIG. 3B along the lower profile. The initial variable resistance material layer 152 may be formed by atomic layer deposition (ALD) or chemical vapor deposition (CVD) having a desirable step coverage characteristic. The initial variable resistance material layer 152 may have a small thickness by controlling the deposition time or the like.

Then, an insulating material 162 is deposited on the initial variable resistance material layer 152 to a sufficient thickness to fill the trench T. The insulating material 162 may include oxide or nitride.

Figure 3D:
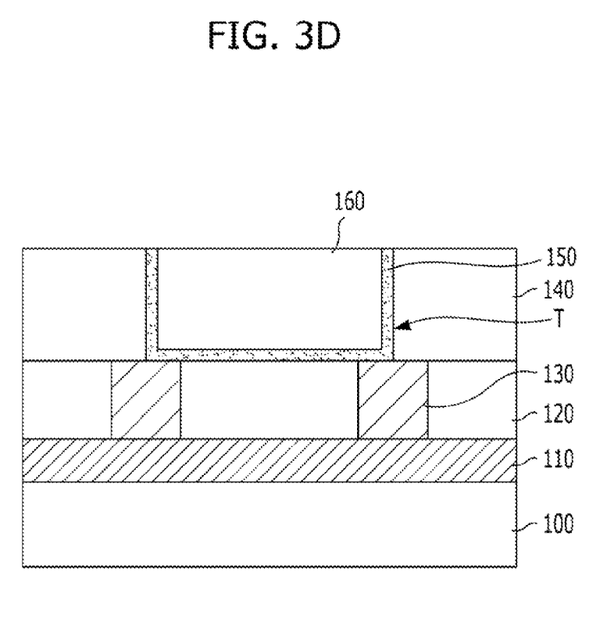

Referring to FIG. 3D, a planarization process, for example, chemical mechanical polishing (CMP) is performed on the insulating material 162 and the initial variable resistance material 152 until the second insulating layer 140 is exposed. As a result, a variable resistance material layer 150 is formed along both sidewalls and the bottom surface of the trench T, and the rest of the space in the trench T is filled with an insulating pattern 160.

Referring to FIG. 2B, a third insulating layer 170 is formed over the structure shown in FIG. 3D.

The third insulating layer 170 is selectively etched to form contact holes exposing the variable resistance material layer 150, and the contact holes are then filled with a conductive material to form a plurality of upper conductive contacts 180. As described above, the upper conductive contacts 180 are formed at the respective intersections between the lower conductive lines 110 and the upper conductive lines to be described below. Furthermore, the upper conductive contacts 180 may overlap the lower conductive contacts 130.

Then, a conductive material is deposited on the third insulating layer 170 and the upper conductive contacts 180, and selectively etched to form a plurality of upper conductive lines 190 extending in the second direction. Each of the upper conductive lines 190 is contacted with the upper conductive contacts 180 arranged in the second direction.

The variable resistance memory device and the method for fabricating the same in accordance with the first embodiment of the present invention may have the following effects.

First, when an etch process for the variable resistance material layer 150 is not required during the formation of the variable resistance material layer 150, an impact caused by etching and a defect such as leakage current caused by the impact may be prevented from occurring, and the fabrication may become simpler and cost may be reduced.

Furthermore, the variable resistance material layer 150 contacted with the upper conductive contact 180 may have a small width by controlling the deposition thickness of the initial variable resistance material layer 152. Therefore, the integration degree of the device may increase, and the switching characteristic may also improve.

Furthermore, the variable resistance material layer between the lower conductive contact 130 and the upper conductive contact 180 forms a unit memory cell. Accordingly, since two unit memory cells may be simultaneously formed on the line A-A', the process may be simplified, and the integration degree may further increase.

In the first embodiment of the present invention, it has been described that the trench T is extended in the direction parallel to the upper conductive line 190 and both sidewalls of the trench T overlap two adjacent upper conductive lines 190, respectively, but the present invention is not limited thereto. In FIGS. 2A to 2C, the positions of the upper conductive line 190 and the lower conductive line 110 may be switched. In this case, the trench T is extended in the direction parallel to the lower conductive line 110, and both sidewalls of the trench T may overlap two adjacent lower conductive lines 110, respectively.

Furthermore, in the first embodiment of the present invention, it has been described that the lower conductive contact 130 and the upper conductive contact 180 are used as two electrodes of a unit memory cell, but the present invention is not limited thereto. The lower conductive contact 130 and/or the upper conductive contact 180 may be omitted. Hereinafter, referring to FIGS. 4 to 6 this will be described in more detail, and the following descriptions will be focused on differences from the first embodiment of the present invention.

Figure 4:
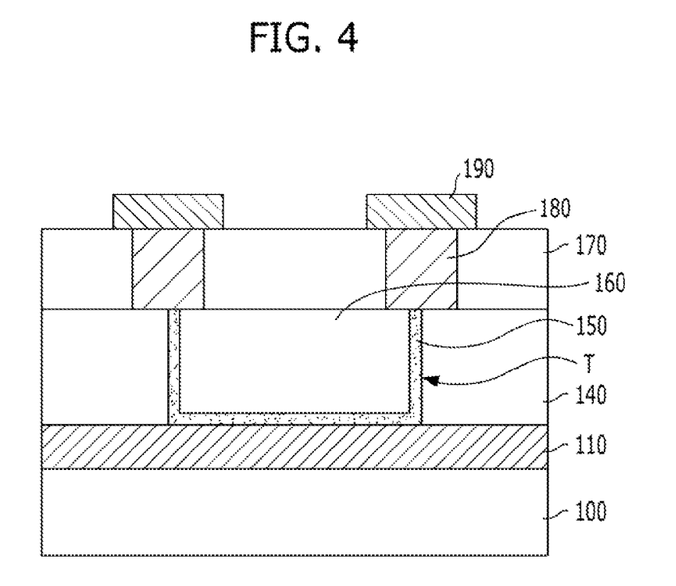
FIG. 4 is a diagram illustrating a variable resistance memory device in accordance with a second embodiment of the present invention.

FIG. 4 is a diagram illustrating a variable resistance memory device in accordance with a second embodiment of the present invention.

Referring to FIG. 4, the variable resistance memory device in accordance with the second embodiment of the present invention has a structure in which the lower conductive contacts 130 and the first insulating layer 120 are omitted from the first embodiment of the present invention. In this case, the bottom surface of the variable resistance material layer 150 in the trench T is directly contacted with the lower conductive line 110. At the portion contacted with the variable resistance material layer 150, the lower conductive line 110 may be used as a bottom electrode of a unit memory cell.

Figure 5:
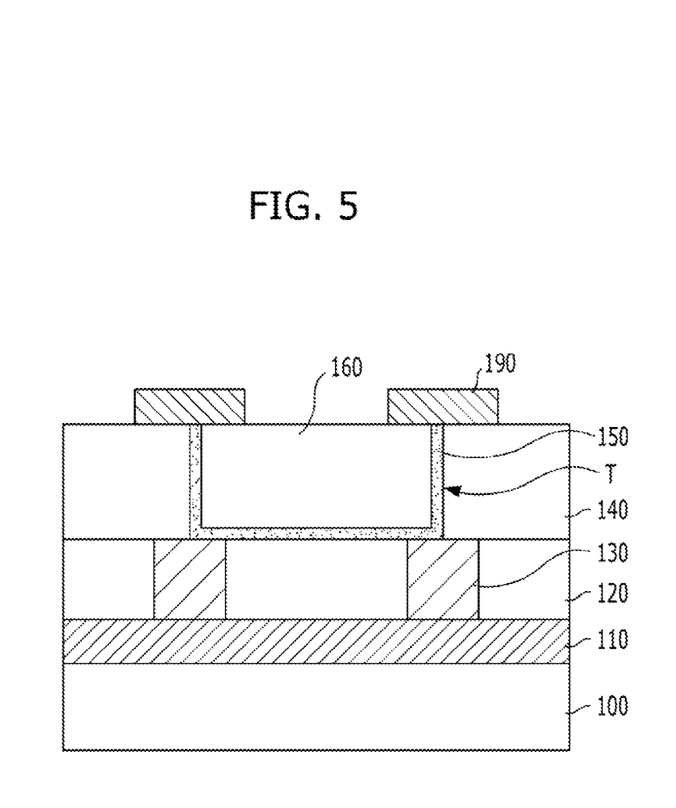
FIG. 5 is a diagram illustrating a variable resistance memory device in accordance with a third embodiment of the present invention.

FIG. 5 is a diagram illustrating a variable resistance memory device in accordance with a third embodiment of the present invention.

Referring to FIG. 5, the variable resistance memory device in accordance with the third embodiment of the present invention has a structure in which the upper conductive contacts 180 and the third insulating layer 170 are omitted from the first embodiment of the present invention. In this case, the top surface of the variable resistance material layer 150 in the trench T is directly contacted with the upper conductive line 190. At the portion contacted with the variable resistance material layer 150, the upper conductive line 190 may be used as a top electrode of a unit memory cell.

Figure 6:
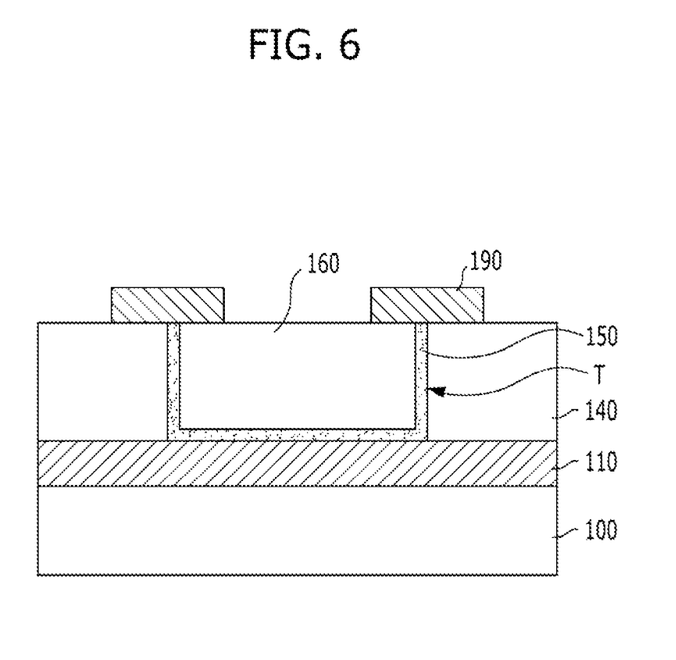
FIG. 6 is a diagram illustrating a variable resistance memory device in accordance with a fourth embodiment of the present invention.

FIG. 6 is a diagram illustrating a variable resistance memory device in accordance with a fourth embodiment of the present invention.

Referring to FIG. 6, the variable resistance memory device in accordance with the fourth embodiment of the present invention has a structure in which the lower conductive contacts 130, the first insulating layer 120, the upper conductive contacts 180, and the third insulating layer 170 are omitted from the first embodiment of the present invention. In this case, the bottom surface of the variable resistance material layer 150 in the trench T is directly contacted with the lower conductive line 110, and the top surface of the variable resistance material layer 150 in the trench T is directly contacted with the upper conductive line 190. At the portions contacted with the variable resistance material layer 150, the lower conductive line 110 and the upper conductive line 190 may be used as bottom and top electrodes of a unit memory cell, respectively.

Methods for fabricating the devices in accordance with the second to fourth embodiments of the present invention are performed in substantially the same manners as the fabrication method in accordance with the first embodiment of the present invention, from which formation steps of the omitted components are omitted. Therefore the detailed descriptions are omitted herein.

In the variable resistance memory devices in accordance with the first to fourth embodiments of the present invention, each memory cell may further include a selection element connected in series to one end of the variable resistance material layer 150.

The variable resistance memory devices in accordance with the first to fourth embodiments of the present invention have a cross-point structure in which memory cells are connected to each other through the lower conductive line 110 or the upper conductive line 190. Therefore, when a bias for driving a selected memory cell is applied to a corresponding conductive line a sneak current may occur through unselected memory cells. In order to prevent the sneak current, a selection element that hardly passes a current at a predetermined threshold voltage or less may be used. Hereafter, this will be described with reference to FIGS. 7A and 78.

Figure 7A:
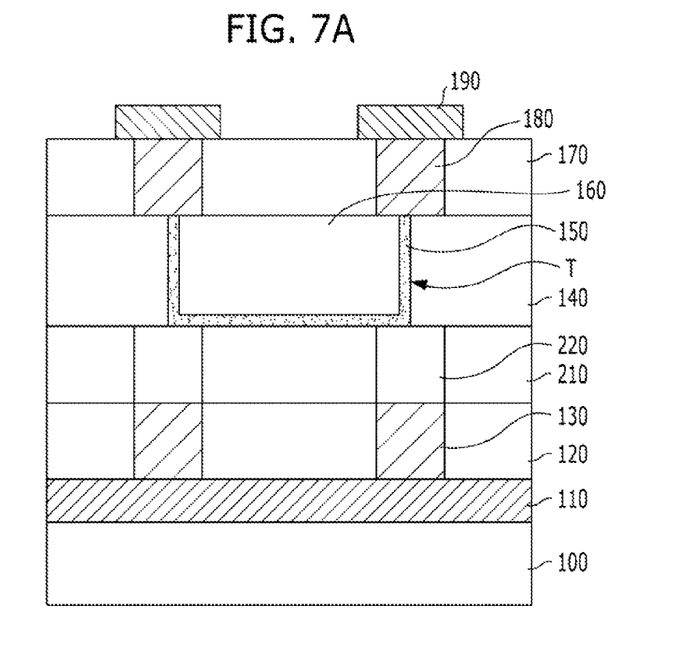
FIG. 7A is a diagram illustrating a variable resistance memory device in accordance with a fifth embodiment of the present invention.
Figure 7B:
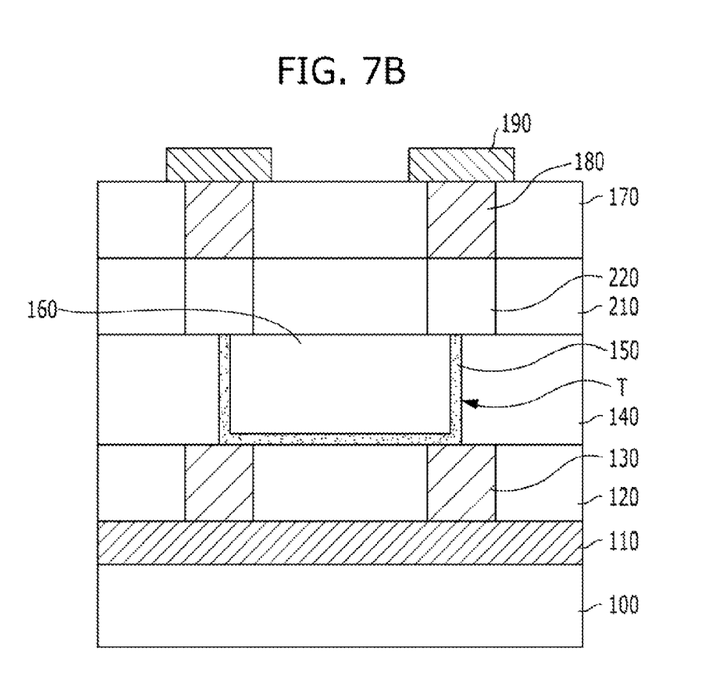
FIG. 7B is a diagram illustrating a variable resistance memory device in accordance with a sixth embodiment of the resistance memory device.

FIG. 7A is a diagram illustrating a variable resistance memory device in accordance with a fifth embodiment of the present invention. FIG. 7B is a diagram illustrating a variable resistance memory device in accordance with a sixth embodiment of the resistance memory device. FIGS. 7A and 78 illustrate that the variable resistance memory device in accordance with the first embodiment of the present invention further includes a selection element.

Referring to FIG. 7A, a selection element 220 is interposed between the upper conductive contact 130 and the variable resistance material layer 150 and connected in series to the bottom of the variable resistance material layer 150. Between the selection elements 220, an insulating material 210 may be buried.

The selection element 220 may include a diode such as a P-N diode or Schottky diode, but the present invention is not limited thereto. Furthermore, the selection element 220 may be disposed to overlap the lower conductive contact 130.

Referring to FIG. 7B, a selection element 220 is interposed between the upper conductive contact 170 and the variable resistance material layer 150, respectively, and connected in series to the top of the variable resistance material layer 150. At this time, the selection element 220 may be disposed to overlap the upper conductive contact 180.

That is, the selection element 220 may be connected in series to the top or bottom of the variable resistance material layer 150, and may be formed at an intersection between the lower conductive line 110 and the upper conductive line 190. Although not illustrated, the selection element 220 may also be included in the devices in accordance with the second to fourth embodiments of the present invention.

In accordance with the embodiment of the present invention, it is possible to secure a uniform switching characteristic, increase the integration degree, and simplify the process.

While the present invention has been described with respect to the specific embodiments, it will be apparent to those skilled in the art that various changes and modifications may be made without departing from the spirit and scope of the invention as defined in the following claims.

What is claimed is:

1. A variable resistance memory device comprising:
   a plurality of first conductive lines extended in a first direction;
   a plurality of second conductive lines arranged over or under the first conductive lines and extended in a second direction crossing the first direction;
   an insulating layer disposed between the first conductive lines and the second conductive lines and having a trench extended in the second direction and defined by a first sidewall and a second sidewall facing each other and a bottom surface connecting the first sidewall and the second sidewall; and
   a variable resistance material layer formed on the first and second sidewalls and the bottom surface of the trench,
   wherein the first and second sidewalls of the trench overlap two adjacent second conductive lines, respectively.

2. The variable resistance memory device of claim 1, further comprising first conductive contacts disposed at the intersections between the first and second conductive lines and interposed between the variable resistance material layer and the first conductive lines.

3. The variable resistance memory device of claim 1, further comprising second conductive contacts disposed at the intersections between the first and second conductive lines and interposed between the variable resistance material layer and the second conductive lines.

4. The variable resistance memory device of claim 1, further comprising:
   first conductive contacts disposed at the intersections between the first and second conductive lines and interposed between the variable resistance material layer and the first conductive lines; and
   second conductive contacts disposed at the intersections between the first and second conductive lines and interposed between the variable resistance material layer and the second conductive lines.

5. The variable resistance memory device of claim 1, further comprising an insulating pattern filling the rest of the space in the trench having the variable resistance material layer formed therein.

6. The variable resistance memory device of claim 1, wherein the variable resistance material layer is extended in the second direction.

7. The variable resistance memory device of claim 4, wherein a contact area between the variable resistance material layer and each first conductive contact is larger than a contact area between the variable resistance material layer and each second conductive contact.

8. The variable resistance memory device of claim 1, wherein the variable resistance material layer on the first sidewall of the trench, overlapping the first conductive lines, forms a first memory cell, and
the variable resistance material layer on the second sidewall of the trench, overlapping first conductive lines, forms a second memory cell.

9. The variable resistance memory device of claim 8, wherein the variable resistance material layers of the first and second memory cells are connected to each other in the trench.

10. The variable resistance memory device of claim 1, further comprising a selection element disposed at each of the intersections between the first and second conductive lines and connected to the top or bottom of the variable resistance material layer.

11. A variable resistance memory device comprising:
an insulating layer formed over a substrate and having a trench extended in a second direction, that is defined by a first sidewall and a second sidewall facing each other and a bottom surface connecting the first sidewall and the second sidewall;
a variable resistance material layer formed on the first and second sidewalls and the bottom surface of the trench;
an insulating pattern formed over the variable resistance material layer and filling the trench;
a plurality of first conductive lines extended in a first direction; and
a plurality of second conductive lines arranged over or under the first conductive lines and extended in the second direction crossing the first direction,
wherein the insulating layer disposed between the first conductive lines and the second conductive lines, and the first and second sidewalls of the trench overlap two adjacent second conductive lines, respectively.

12. The device of claim 11, further comprising:
first conductive contacts disposed at the intersections between the first and second conductive lines and interposed between the variable resistance material layer and the first conductive lines; and
second conductive contacts disposed at the intersections between the first and second conductive lines and interposed between the variable resistance material layer and the second conductive lines.

* * * * *